United States Patent
Makino et al.

(10) Patent No.: US 8,198,954 B2
(45) Date of Patent: Jun. 12, 2012

(54) IMPEDANCE MATCHED CIRCUIT BOARD

(75) Inventors: Kimiyasu Makino, Komaie (JP); Shinji Kajiwara, Tokyo (JP)

(73) Assignee: Molex Incorporated, Lisle, IL (US)

( * ) Notice: Subject to any disclaimer, the term of this patent is extended or adjusted under 35 U.S.C. 154(b) by 247 days.

(21) Appl. No.: 12/438,419

(22) PCT Filed: Aug. 22, 2007

(86) PCT No.: PCT/US2007/018589
§ 371 (c)(1),
(2), (4) Date: Aug. 2, 2010

(87) PCT Pub. No.: WO2008/024411
PCT Pub. Date: Feb. 28, 2008

(65) Prior Publication Data
US 2010/0289596 A1 Nov. 18, 2010

(30) Foreign Application Priority Data
Aug. 22, 2006 (JP) ................................. 2006-225218

(51) Int. Cl.
*H03H 7/38* (2006.01)
(52) U.S. Cl. .......................................... 333/33; 333/238
(58) Field of Classification Search ............... 333/33, 333/34, 238, 246, 260
See application file for complete search history.

(56) References Cited

U.S. PATENT DOCUMENTS

| | | | |
|---|---|---|---|
| 4,837,529 A | 6/1989 | Gawronski et al. | |
| 8,085,112 B2 * | 12/2011 | Kushta et al. | 333/33 |
| 2006/0208835 A1 | 9/2006 | Lee | |
| 2006/0284699 A1 * | 12/2006 | Weiske | 333/33 |

FOREIGN PATENT DOCUMENTS
TW 247453 1/2006

OTHER PUBLICATIONS

Wartenberg et al., "A Coaxial-to-Microstrip Transition for Multilayer Substrates," IEEE Transactions on Microwave Theory and Techniques, Feb. 2004, p. 584-588, vol. 52, No. 2.
International Search Report for PCT/US2007/018589.

* cited by examiner

*Primary Examiner* — Stephen Jones
(74) *Attorney, Agent, or Firm* — Timothy M. Morella

(57) ABSTRACT

An impedance matched circuit board utilizes a series of vias, one signal via that is surrounded by four ground vias in order to effect impedance matching with a coaxial signal transmission line. The vias are plated and extend through the thickness of the circuit board. Both opposing surfaces of the circuit board are provided with a conductive ground layer and each such ground layer has an opening formed there that encompasses one or more of the vias. On the top surface the opening surrounds the signal and ground via and on the bottom surface the opening only partially surrounds the signal via and the opening includes a convex portion formed therein.

18 Claims, 3 Drawing Sheets

IMPEDANCE MATCHED CIRCUIT BOARD

BACKGROUND OF THE INVENTION

The present invention relates generally to circuit boards and more particularly to impedance matched circuit boards.

Conventionally, in order to connect a high-frequency coaxial connector for transmitting signals at high frequencies such as a microwave to a microstrip line formed on a circuit board, a circuit structure arranging a ground layer around the microstrip line and at the rear side of the circuit board is used. This is shown in Japanese Utility Model Application Laid-Open (Kokai) No. 5-82111.

FIG. 4 is a view showing a circuit structure, which is formed on a surface of a conventional circuit board, and FIG. 5 is a view showing a circuit structure, which is formed on other surface of the conventional circuit board.

In FIGS. 4 and 5, 801 denotes a first ground layer formed by a metallic film and formed on one face of a circuit board made of a dielectric material, and 802 denotes a second ground layer formed by a metallic film formed on other face of the circuit board. In addition, 803 denotes a first through-hole, or via, penetrating through the circuit board; and circular first relief part 808 and circular second relief part 809, from which the first ground layer 801 and the second ground layer 802 are removed at a predetermined radius, are formed around the first through-hole 803. 804 denotes a second through-hole penetrating through the circuit board, and a plurality of such through-holes 804 are arranged so as to encircle the periphery of the first through-hole 803 in a horseshoe shape. Further, conductive metal plating is applied onto the inner circumferential faces of the first through-hole 803 and the second through-holes 804.

In addition, a soldering part 806 is formed on the first via 803 on one surface of the circuit board and the end of a microstrip line 807 made of a metallic film is connected to the first through-hole 803. Then, a central conductor of the high-frequency coaxial connector (not illustrated) is connected to the first via 803 by the soldering part 806. Further, the external conductor of the high-frequency coaxial connector is connected to the second ground layer 802.

Here, the first ground layer 801 is connected to the second ground layer 802 by the second vias 804, so that the external conductor of the high-frequency coaxial connector, the vias 804, the first ground layer 801, and the second ground layer 802 have the same potentials. Therefore, the central conductor of the high-frequency coaxial connector and the first via 803 and the microstrip line 807, which are connected to this central conductor, are encircled by the external conductor of the high-frequency coaxial connector, the second vias 804, the first ground layer 801, and the second ground layer 802 having the same potentials, so that it is possible to make an electric property of a connecting portion providing an electric connection between the high-frequency coaxial connector and the circuit board stable.

Nevertheless, according to the conventional circuit structure, since both of the first ground layer 801 and the second ground layer 802 are formed around the first via 803 and the second via 804, a third layer must be provided for forming the microstrip line 807.

In addition, a first opening 808 and a second opening 809 formed on the first ground layer 801 and the second ground layer 802, respectively, are positioned inside the second vias 804, and this results in that they have substantially the same shapes and sizes. Therefore, appropriate matching of electric impedance cannot be accomplished.

SUMMARY OF THE INVENTION

Taking the foregoing problems encountered by the conventional art into consideration, the present invention has an object to provide a circuit board having a configuration such that a convex portion of a reference electric potential layer is formed in a region of a relief part around a through-hole, or via, which is formed on a face at the opposite side of a face on which a signal thin line functioning as a microstrip line is formed, so as to correspond with the signal thin line, thereby simplifying a structure of a connecting portion of a high-frequency coaxial connector while enabling it to easily and appropriately accomplish matching of electric impedance.

Therefore, a circuit board in accordance with the present invention comprises a via for signal, to which a central conductor of a high-frequency coaxial connector is connected; vias for reference potential (i.e. ground vias), arranged around a periphery of the signal via and allowing a terminal for shield of the high-frequency coaxial connector to be connected thereto; a first reference potential (i.e. ground) layer formed by a conductive film disposed on one surface of the circuit board; a thin signal line, which is connected to the signal via on the one surface, the thin signal line being formed of a conductive strip, and functioning as a microstrip line; and a second reference potential(i.e. ground), layer formed by a conductive film arranged on other surface of the circuit board; wherein the first ground layer is provided with a first opening in which a portion of the conductive film is removed so as to encircle the periphery of the live signal via; and wherein the second ground layer is provided with a second opening part in which a portion of the conductive film is removed so as to encircle the periphery of the signal via and a convex portion configured to protrude toward the signal via at the region corresponding with the thin signal line in the second opening.

In another circuit board according to the present invention, the concave portion further has a width thereof not less than seven times as large as the width of the signal thin line.

In a further circuit board according to the present invention, further, a distance a front end of the concave portion is spaced from the via for signal is set depending on dielectric voltage to be specified.

In a still further circuit board according to the present invention, the first ground further includes a first auxiliary opening, from which the conductive film is removed so as to have a width not less than three times as large as the width of the thin signal line at the opposite sides of the thin signal line, respectively.

In a still another circuit board according to the present invention, the first opening accommodates within its perimeter, the signal via and all of the ground vias, the first opening being connected to the first auxiliary opening, and the second opening accommodates, within its perimeter, the signal via but none of the ground vias.

In accordance with the present invention, the circuit board has the convex portion of the second ground layer, which is formed at the region corresponding to the thin signal line in the opening around the through-hole, which is formed on the face opposite to the circuit board tow surface on which the thin signal line functioning as the microstrip line is formed. Hence, the connecting portion of the high-frequency coaxial connector is simplified in its structure while enabling it to easily and appropriately accomplish matching of an electric impedance of the circuit board.

DESCRIPTION OF THE PREFERRED EMBODIMENTS

Preferred embodiments of the present invention will be described below in detail with reference to the accompanying drawings. FIG. 1 is a view showing a circuit board according to an embodiment of the present invention. Further, FIG. 1A shows a face on which a microstrip line is formed, and FIG. 1B shows a face of the opposite side thereof.

Figure 1A:
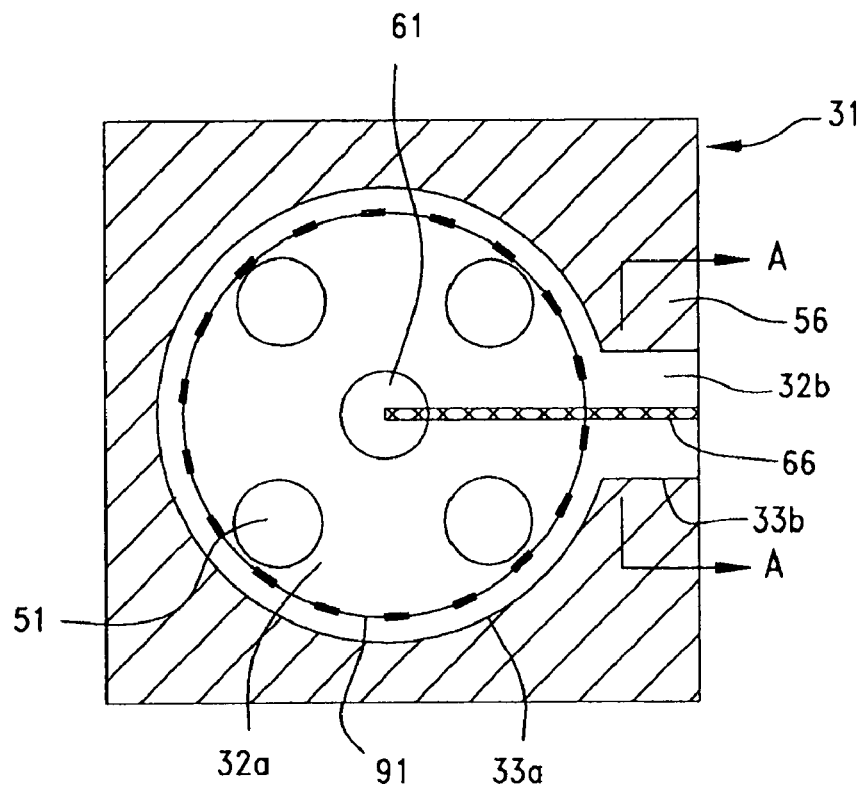
FIG 1A is a top plan view of a circuit board constructed in accordance of the principle of the present invention.
Figure 1B:
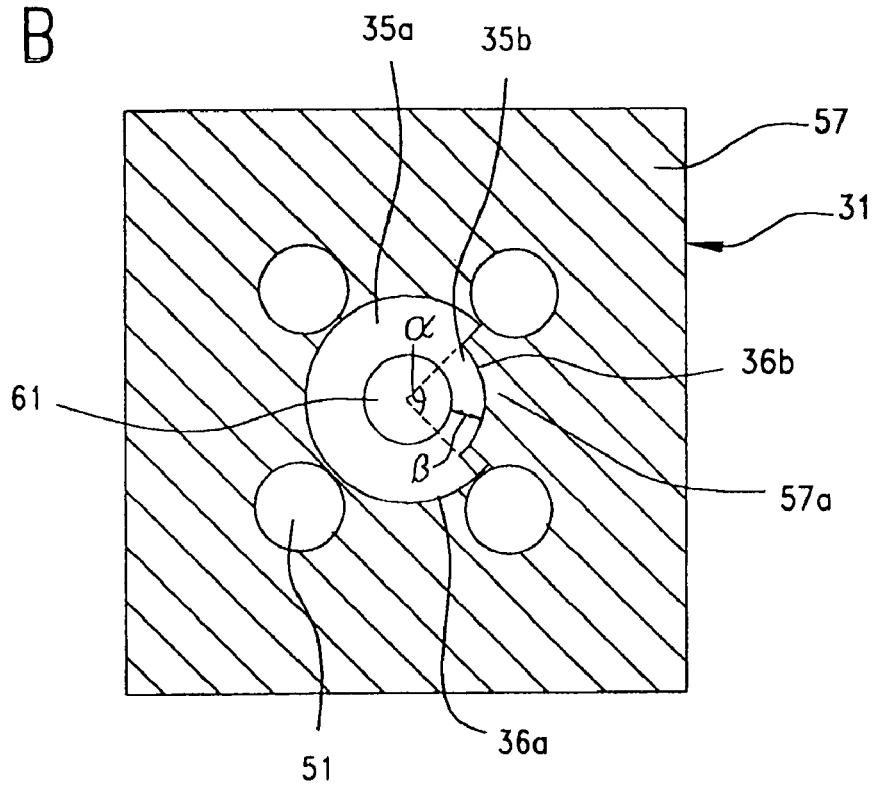
FIG. 1B is a bottom plan view of the circuit board of FIG. 1A; according to an embodiment of the present invention.

In FIGS. 1A & B, the circuit board 31 is used for an electronic device using a high frequency wave, for example, a telecommunication device, and a measurement device or the like. Then, for example, a high-frequency coaxial connector such as a SMA (Sub-Miniature Type A) connector (not illustrated) is connected to the circuit board 31. In this embodiment, representations of directions such as up, down, left, right, front, rear, and the like, used for explaining the structure and movement of each part of the circuit board 31, and the like, are not absolute, but relative. These representations are appropriate when each part of the circuit board 31, and the like, is in the position shown in the figures. If the position of the circuit board 31, and the like, changes, however, it is assumed that these representations are to be changed according to the change of the position of the circuit board 31, and the like.

The circuit board 31 is preferably a planar member, and is made of a dielectric material such as polyimide. As shown in FIG. 1A, one surface of the circuit board 31 is covered with a first ground layer 56 as a first reference electric potential layer, and as shown in FIG. 1B, the other surface of the circuit board 31 is also covered with a second ground layer 57 as a second reference electric potential layer. The first ground layer 56 and the second ground layer 57 are a conductive film, respectively, made of a metal with a low conductive resistance, for example, copper. These ground layers are laminated on the surfaces of the circuit board 31. Further, the first ground layer 56 and the second ground layer 57 may be used as a power source layer for supplying a power source current to diverse kinds of electronic elements such as an IC (not illustrated) to be mounted on the circuit board 31. However, in thin deception they will be explained as being only a ground layer used for grounding.

On the circuit board 31, penetrating through thickness of the circuit board 31 is a through-hole, or via, 61 for a signal is formed. Further, as encircling the periphery of this signal via 61, a plurality of through-holes or vias 51 for ground, for example, four ground vias are formed as vias for a reference electric potential to travel through the circuit board 31 in the thickness direction. It is preferable that these ground vias 51 are generally formed on a circle encircling the periphery of the signal via 61 and at positions that preferably equally divide the circle.

In addition, it is assumed that all of the ground vias 51 have the same sizes. For example, they are arranged so as to have diameters of approximately 1.6 mm and intervals between the adjacent holes, namely, pitches 5.0 mm. On the other hand, the signal via 61 may have a size different from that of the ground via 51. The explanation herein assumes that the signal via 61 has the same size as that of the ground vias 51.

The inner peripheral faces of the ground vias 51 and the signal via 61 contain a coating film made of a metal with a low conductive resistance, for example, copper (formed by plating or the like). The circuit board 31 has a land formed thereon in the shape of an annularly extending guard so as to encircle the periphery of the opposite ends of the ground vias 51 and the signal vias 61.

This land is a coating or a film made of a metal with a low conductive resistance, which is integrally formed with the film covering the inner peripheral faces of the ground vias 51 and the signal via 61. For example, the external diameter of each land is approximately 2.0 mm.

Then, a central conductor set of a high-frequency coaxial connector (not illustrated) is connected to the signal via 61. This central conductor is also made of a metal with a low conductor resistance such as copper and is connected to the central conductor of the high-frequency coaxial cable terminated by the high-frequency coaxial connector so as to transmit a high frequency signal. Therefore, a high frequency signal is transmitted to the signal via 61. In addition, a terminal for the shield of the same high-frequency coaxial connector is connected to the ground vias 51. This terminal is made of a conductive metal to be connected to a shield wire of the high-frequency coaxial cable, which is terminated to the high-frequency coaxial connector.

As shown in FIG. 1A, the top surface of the circuit board 31 has a first relief part, or opening 32a, in which the conductive film of the first ground layer 56 is removed. This first opening 32a is defined by a circular first pattern line 33a indicating a boundary against the top surface ground layer 56. This first pattern line 33a is a circle centering on the center of the for signal via 61, and it is assumed that the first pattern line 33a has the size so as to be able to contain the signal via 61 and the ground vias 51, for example, a diameter 112.0 mm. Reference numeral 91 denotes a dashed line that indicates the outline or edge of the coaxial connector mentioned above that is connected to the circuit board 31.

The first opening 32a is a part where the first ground layer 56 is removed and the dielectric material of the circuit board 31 is exposed outside to contain therein the signal via 61 and all the ground hole vias 51 through-holes. This first opening 32a is slightly larger than the outline 91 of the coaxial connector. The lands are formed at the ends of the ground via 51 and the signal via 61 as encircling the respective peripheries thereof. These lands are also contained in the first opening part 32a. Therefore, the lands for all of the signal vias 61 are unconnected to the first ground layer 56. The lands for respective signal vias 61 are mutually kept in an unconnected state, and the lands of the ground vias 51 and the land of the signal via 61 are also unconnected to each other.

Further, on the top surface of the circuit board 31, a thin signal line 66 is provided to function as a microstrip line. According to the illustrated example, this thin signal line 66 has one end thereof connected to the signal via 61, and is extended in the right direction (as shown in the drawings) between of two ground vias 51, which are arranged on the right side. In this case, in a range outside the first opening 32*a*, a first auxiliary opening 32*b* is formed on each of the opposite sides of the thin signal line 66 as the opening from which the conductive film of the first ground layer 56 is removed. The first auxiliary opening 32*b* is a portion, which is defined by second pattern lines 33*b* parallel to a thin signal line 66 indicating a boundary to the first ground layer 56 and where the dielectric material of the circuit substrate 31 is exposed due to removal of the first ground layer 56. Moreover, since the first auxiliary opening 32*b* is connected to the first opening 32*a*, the first pattern line 33*a* is not defined as a complete circle but is formed in a shape having a part of the circle cut to be connected to the second pattern line 33*b*. When combined the first opening 32*a* and 32*b* exhibit a spoon-like shape(FIG 1A).

The thin signal line 66 is a narrow line formed by a foil or a film made of a metal with a low conductive resistance such as copper. For example, the thin signal line 66 can be formed from the first ground layer 56 by a patterning method employing etching, laser-machining and so forth. However, the thin signal line 66 may be formed by means of any other methods. Further, the thin signal line 66 is connected to the land of the signal via 61. The thin signal line 66 is not connected to the land of the ground via 51.

As shown in FIG. 1B, on the other bottom surface of the circuit board 31, a second opening 35*a* is formed where the conductor film of the second ground layer 57 has been removed. This second opening 35*a* is defined by a circular third pattern line 36*a* defining a boundary in the second ground layer 57. This third pattern line 36*a* is a circle coaxial with the signal via 61 is sized to include therein the signal via 61. Furthermore, the ground vias 51 ground are located outside the third pattern line 36*a*, so that all of the ground vias 51 are connected to the second ground layer 57.

It is preferred that the second opening part 35*a* is large as possible within a range not including the ground via 51 for ground. It is preferred that the third pattern line 36*a* is defined to have a size thereof permitted to be in contact with each ground via 51, for example, a diameter approximately 5.2 mm.

It is desirable that the second ground layer 57 extends over the entire range in a longitudinal direction of the thin signal line 66 in view of appropriately achieving matching of impedance, namely, reducing mismatching of impedance. Therefore, on a part of the second ground layer 57 corresponding to an intermediate area extending between two ground vias 51 through which area the thin signal line 66 extended on the top surface of the circuit board 31, a convex portion 57*a* is formed so as to protrude toward the signal via 61. Then, the second relief part 35*a* opposing this convex portion 57*a* is formed in a second auxiliary opening 35*b* as an opening of a smaller diameter.

As shown in FIG. 1B, a fourth pattern line 36*b* defining a boundary between the convex portion 57*a* and the second auxiliary opening 35*b* is a circular arc. Then, in order to reduce the mismatching of impedance, it is preferred that the convex portion 57*a* comes close to the signal via 61 as much as possible. Therefore, a radius of the fourth pattern line 36*b* is approximately 1.3 mm, for example. The radius of the fourth pattern line 36*b* is determined to be slightly larger than the half of the outline (about 2.0 mm) of the afore-described land of the signal via 61 in order for the convex portion 57*a* not to contact the land but not to be separated apart from the land so much. Further, it is preferred that a value of "β" which indicates a distance from the land of the signal via 61 up to the front end of the convex portion 57*a* is as small as possible within the range that the insulation between the land and the convex portion 57*a* is not broken. In other words, it is preferred that the value of the distance "β" is preset to the shortest in a range that enables to endure a withstanding voltage according to an insulation resistance between the land and the convex portion 57*a*, namely, a withstanding voltage property between the land and the convex portion 57*a*. In addition, according to the example shown in FIG. 1B, a value of "α", which is a center angle of the fourth pattern line 36*b* of the circular arc, is 90°, however, this angle may be appropriately changed.

Then, the high-frequency coaxial connector is connected to one face of the circuit board 31 as shown in FIG. 1A. Further, a terminal for shield of the high-frequency coaxial connector is connected to the ground via 51, and the central conductor of the high-frequency coaxial connector for transmitting a high-frequency signal is connected to the signal via 61. In this case, the first opening 32*a* and the first auxiliary opening 32*b* are formed large and the first ground layer 56 is spaced away from the thin signal line 66, so that the first ground layer 56 has no influence on the electric impedance of the thin signal line 66. Further, the ground via 51 is located to connect to the second ground layer 57 in the first opening part 32*a*. However, the area of the land thereof is small, and the ground via 51 has no influence on the electric impedance of the thin signal line 66. In addition, on the bottom surface of the circuit board 31 as shown in FIG. 1B, the second relief part 35*a* is formed larger, so that it is also possible to diminish any adverse influence on the electric impedance by the second ground layer 57.

As a result, the impedance of the thin signal line 66 is determined depending on only coupling thereof with the second ground layer 57. In addition, the impedance of the signal thin line 66 is not affected by the signal via 61. Then, on the bottom face of the circuit board 31, only by matching of the second ground layer 57 located at the position corresponding to the thin signal line 66, matching of electric impedance of the thin signal line 66 can be achieved. In other words, impedance can be brought into being matched. Further, the second ground layer 57 comes close to the signal via 61 only at the concave portion 57*a*, it is possible to reduce mismatching of impedance.

Next, a modified example of the concave portion 57*a* of the second ground layer 57 will be described.

Figure 2:
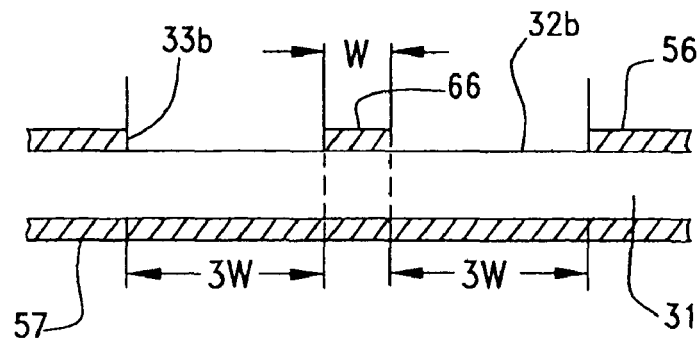
FIG. 2 is a cross-sectional view taken along a line A-A of FIG. 1A, showing a distant relationship between the microstrip line and a first ground layer according to the embodiment of the present invention.
Figure 3:
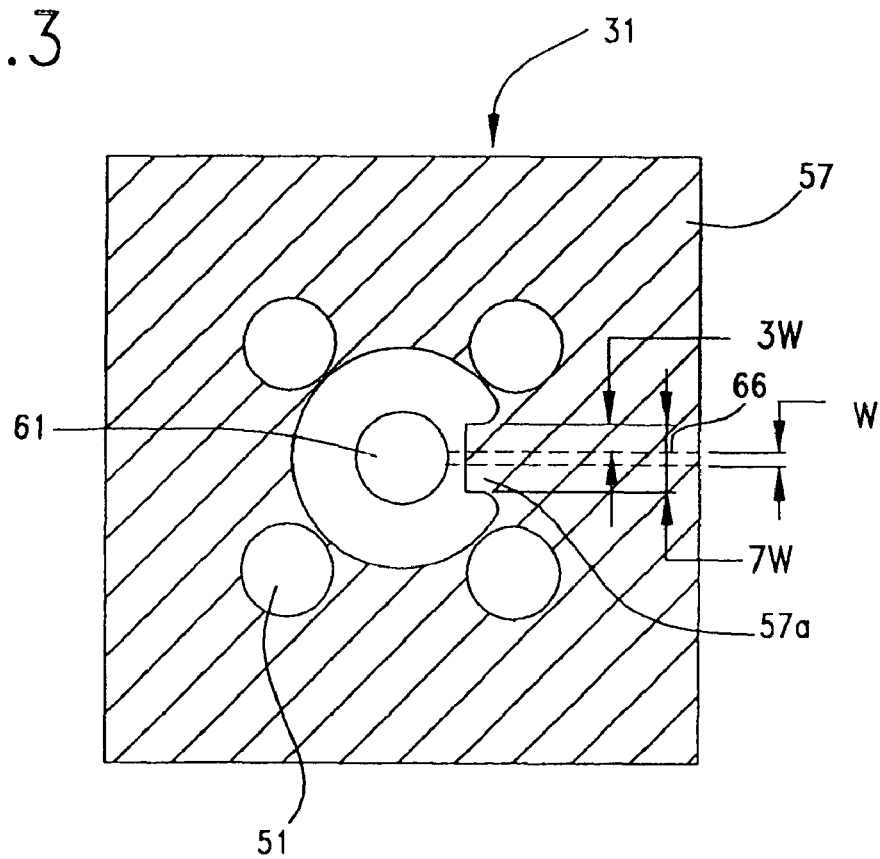
FIG. 3 is a view showing a modified example of a convex portion of a second ground layer according to the embodiment of the present invention.
Figure 4:
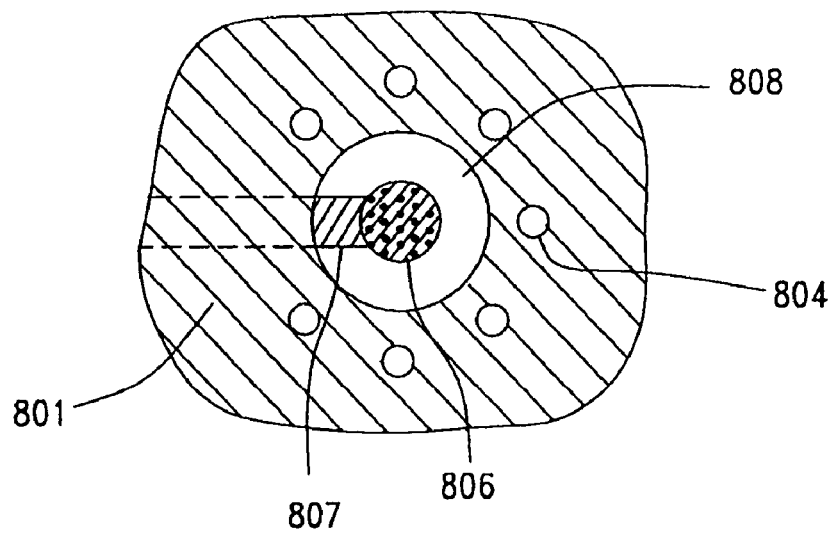
FIG. 4 is a view showing a circuit structure, which is formed on one face of a conventional circuit board.
Figure 5:
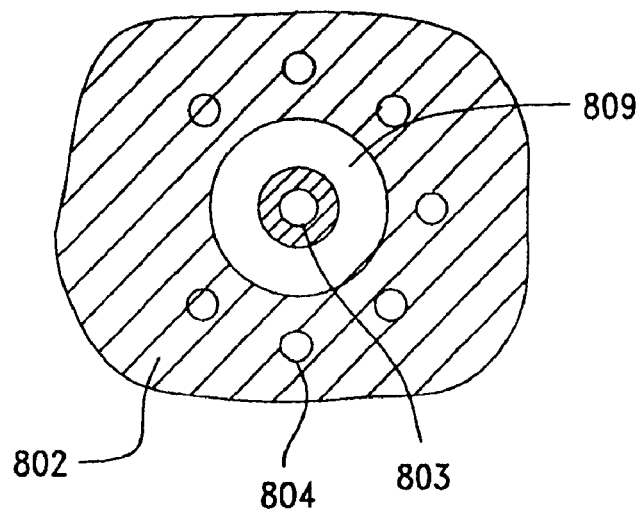
FIG. 5 is a view showing a circuit structure, which is formed on other face of the conventional circuit board.

FIG. 2 is a cross-sectional view, taken along the line A-A of FIG. 1A showing a distant relationship between a microstrip line and a first ground layer, according to the embodiment of the present invention, and FIG. 3 is a view showing a modified example of a convex portion of a second ground layer according to the embodiment of the present invention.

Generally, in the case where a width of a thin signal line made of a belt-like metallic material is defined as "W", if the width of the part from which a metallic layer is removed at the opposite ends of the signal thin line is set in a range of 3 W through 5 W, even in the case of a coplanar structure provided with a ground layer, the signal thin line can be considered as a microstrip line. Therefore, according to the present embodiment, as shown in FIG. 2, if the width of the thin signal line 66 is defined to be "W", the widths of the first auxiliary relief parts 32*b* on both sides of the thin signal line 66 are set to be 3 W or more, respectively.

Then, according to the example as shown in FIG. 3, the convex portion 57*a* of the second ground layer 57 is formed in approximately a rectangular shape. In this case, the width of this convex portion 57*a* is preset to be a value obtained from adding the widths of the first auxiliary openings 32*b* on both sides to the width W of the thin signal line 66, namely, the value not less than 7 W. Further, the distance from the land of the signal via 61 up to the front end of the convex portion 57*a* is preferably short as much as possible within a range such that an electric insulation between the land and the convex portion 57*a* is prevented from being broken, similar to the embodiment as illustrated in FIG. 1B.

In this case, as the convex portion 57*a* with the width not less than 7 W is formed, the second ground layer 57 of sufficiently large width is arranged to come, on the signal thin line 66, to a position where it closely opposes the signal via 61, so that the impedance of the thin signal line 66 can be successfully matched on account of matching of the second ground layer 57 and thus, mismatching of impedance can be diminished.

Hence, according to the present embodiment, the first ground layer 56 is provided with the first opening 32*a* where the conductor film is removed so as to encircle the periphery of the signal via 61 with the first opening 32*a*, and the second ground layer 57 is provided with the second opening 35*a* where the conductor film is removed so as to encircle the periphery of the signal via 61 with the second opening 35*a* for signal, along with the concave portion 57*a* protruding toward the through-hole 61 for signal at the region corresponding to the thin signal line 66 in the second opening 35*a*.

Thus, the impedance of the thin signal line 66 can be matched only by matching of the second ground layer 57. In addition, since the second ground layer 57 comes close to the signal via 61 only at the concave portion 57*a*, it is possible to diminish any mismatching of the impedance.

In addition, the concave portion 57*a* has the width not less than seven times as large as the width of the signal thin line 66. In this case, since the second ground layer 57 with a sufficient large width corresponds up to the position adjacent to the signal via 61 in the signal thin line 66, mismatching of the impedance can be diminished.

The present invention is not limited to the above-described embodiments, and may be changed in various ways based on the gist of the present invention, and these changes are not eliminated from the scope of the present invention.

What is claimed:

1. A circuit board having opposite faces comprising:
   conductive signal via extending through the thickness of the circuit board, to which a central conductor of a high-frequency coaxial connector is connected;
   a plurality of conductive ground vias for reference electric potential extending through said circuit board thickness and arranged around a periphery of the signal, via for permitting a terminal for shield of the high-frequency coaxial connector to be connected thereto;
   a first ground layer formed by a conductor film disposed on one of the circuit board faces;
   a thin signal line, which is connected to said signal via and is as a microstrip line on the circuit board face; and,
   a second ground layer formed by a conductor film disposed on the other of said circuit board faces;
   wherein:
   the first ground layer has a first opening turned therein in which the conductive film is removed so as to define a first opening that encircles said via signal; and
   the second ground layer has a second opening formed in which the conductive film is removed so as to define a second opening that encircles the periphery of said signal via, the second opening including a convex portion configured to protrude toward said signal via at a region corresponding to the thin signal line in said second relief part opening.

2. The circuit board according to claim 1, wherein the convex portion has a width not less than seven times as large as a width of the thin signal line.

3. The circuit board according to claim 1, wherein a distance that a front end of the convex portion is spaced away from said signal via is determined depending on a withstanding voltage for insulation.

4. The circuit board according to claim 1, wherein the first ground layer includes a first opening, from which said conductive film is removed so as to have a width not less than three times as large as a width of said thin signal line on both sides of the signal thin line, respectively.

5. The circuit board according to claim 1, wherein
   the first opening contains therein said signal via and all of said ground vias are connected to the first opening; and
   the second opening contains therein the signal via without containing therein any of the ground vias.

6. An impedance matched circuit board for providing a connection with a high-frequency signal transmission line, the circuit board comprising:
   a substrate, the substrate having opposite first and second surfaces, the first and second surfaces supporting respective first and second ground reference layers disposed thereon;
   a signal via extending completely through said substrate, the interior surface of the signal via being coated with a conductive material for connection thereto by a high-frequency signal transmission line, a plurality of ground vias extending completely through said substrate, the ground terminals being spaced from said signal via and from each other such that they are arranged around a periphery of said signal via, the interior surfaces of the ground vias being coated with a conductive material for connection thereto by a ground line for connection thereto by a shield of the high-frequency coaxial connector to be connected thereto;
   the first ground reference layer including a first opening defined therein which encircles said signal via on said substrate first surface, the first opening including a slot portion that extends away from said signal via; and said circuit board further including a conductive signal line extending away from said signal via and through said first opening and the first opening slot portion; and,
   the second ground reference layer including a second opening defined therein which also encircles said signal via on said substrate second surface, the second opening further including a convex portion into which a portion of said second ground reference layer extends toward said signal via in alignment with and in opposition to the conductive signal line on said first surface.

7. The circuit board according to claim 6, wherein the second opening convex portion has an arcuate configuration.

8. The circuit board according to claim 6, wherein said second opening convex portion has a linear configuration.

9. The circuit board according to claim 6, wherein said conductive signal line has a preselected width, W, and said second opening convex portion has a width which is not less than seven times the width W of said conductive signal line.

10. The circuit board according to claim 6, wherein said conductive signal line has a predetermined width W and said first opening slot-like portion has a width equal to 7 W, and said conductive signal line is aligned within said first opening slot-like portion such that said first opening slot-like portion has a width of 3 W on opposite sides of said conductive signal line.

11. The circuit board according to claim 6, wherein a front end of said second opening convex portion is spaced away from said signal via a distance determined depending on a withstanding voltage for insulation.

12. The circuit board according to claim 6, wherein said second opening convex portion projects inwardly of said second opening approximately one half of a radius of said second opening.

13. The circuit board according to claim 6, wherein said ground vias are positioned around said second opening at corners of an imaginary four-sided figure.

14. The circuit board according to claim 6, wherein said second opening convex portion extends toward said signal via within the boundaries of an angle, alpha, that is formed by drawing imaginary lines through two of said ground vias and a center of said signal via.

15. The circuit board according to claim 14, wherein the angle alpha is 90 degrees.

16. The circuit board according to claim 6, wherein said first opening encircles said signal via and said ground vias, and said second opening encircles only said signal via.

17. The circuit board according to claim 16, wherein an inner edge of said first opening is spaced away said ground vias.

18. The circuit board according to claim 16, wherein the inner edge of said first second opening contacts said ground vias.

* * * * *